United States Patent [19]

Sekine et al.

[11] Patent Number: 4,649,408

[45] Date of Patent: Mar. 10, 1987

[54] CHARGE STORAGE TYPE SEMICONDUCTOR DEVICE AND METHOD FOR PRODUCING SAME

[75] Inventors: Hirokazu Sekine, Fujisawa; Katuhiko Morimune, Yokohama; Masaharu Watanabe, Yokosuka; Nobuo Suzuki, Kamakura, all of Japan

[73] Assignee: Tokyo Shibaura Denki Kabushiki Kaisha, Kawasaki, Japan

[21] Appl. No.: 551,001

[22] Filed: Nov. 15, 1983

Related U.S. Application Data

[63] Continuation of Ser. No. 503,645, Jun. 15, 1983, abandoned, which is a continuation of Ser. No. 171,483, Jul. 23, 1980, abandoned.

[30] Foreign Application Priority Data

Jul. 23, 1979 [JP] Japan .................................. 54-92583
May 1, 1980 [JP] Japan .................................. 55-58398

[51] Int. Cl.$^4$ ...................... H01L 29/78; H01L 27/02; H01L 27/14; H01L 29/167
[52] U.S. Cl. ..................... 357/24; 357/23.6; 357/30; 357/41; 357/47; 357/63; 357/64
[58] Field of Search ................ 357/23.6, 24, 41, 47, 357/63, 64, 30

[56] References Cited

U.S. PATENT DOCUMENTS

| | | | |
|---|---|---|---|
| 3,726,719 | 4/1973 | Brack et al. | 357/47 |
| 4,116,719 | 9/1978 | Shimizu et al. | 357/23 |
| 4,210,922 | 7/1980 | Shannon | 357/24 LR |
| 4,240,843 | 12/1980 | Celler et al. | 357/47 |

OTHER PUBLICATIONS

Anolick et al., "Reduction of Alpha Radiation Impact on CCD Memories" IBM Tech. Disclosure Bulletin vol. 22(11/79) p. 2355.

*Primary Examiner*—Gene M. Munson
*Attorney, Agent, or Firm*—Finnegan, Henderson, Farabow, Garrett & Dunner

[57] ABSTRACT

A charge storage type semiconductor device comprising a semiconductor substrate and means for accumulating charge in those portions of the substrate which are located in the vicinity of one of the major surfaces of the substrate. The substrate has a defect region of a high defect density and at least one defect free region having no crystal defects or a low defect density and formed in the vicinity of at least the major surface of the substrate. The defect region prevents unnecessary minority carriers from flowing into charge storage regions.

9 Claims, 8 Drawing Figures

CHARGE STORAGE TYPE SEMICONDUCTOR DEVICE AND METHOD FOR PRODUCING SAME

This is a continuation of U.S. patent application Ser. No. 503,645, filed June 15, 1983, now abandoned, which was a continuation of Ser. No. 171,483, filed July 23, 1980, now abandoned.

This invention relates to a charge storage type semiconductor device and a method for producing the same.

Among the known semiconductor devices having charge storage function are a charge-transfer device, a charge coupled memory, a static memory and a dynamic memory. The charge-transfer device is most popular and is used in various devices such as an image sensor, a memory device, an analogue delay line and a transversal filter.

FIG. 1 is a sectional view of a known charge-transfer type image sensor, showing only one portion which is closely related to this invention. The image sensor comprises a semiconductor substrate 1, an insulating film 2 formed on the substrate 1, a photo electrode 3 made of a transparent conductive material and embedded in the insulating film 2, a light-shielding opaque film 4 so formed on the insulating film 2 that light L reaches only photosensing regions of the sensor, and a layer 5 formed on the substrate 1 for preventing channel regions from being formed. The layer 5 has the same conductivity type as the semiconductor substrate 1 and a high impurity concentration. It separates potential wells 6a and 6b which are formed beneath the photo electrode 3 and which function as picture elements. Thus the layer 5 acts as a potential barrier. The image sensor further comprises means (not shown) to read signals from the potential wells 6a and 6b, one after another.

Now it will be described how the image sensor of FIG. 1 operates. When voltage is applied to the photo electrode 3, the potential wells 6a and 6b are formed in the semiconductor substrate 1 and right below the photo electrode 3. Incident light L passes through the photo electrode 3 and reaches the substrate 1, whereby carriers are generated in that portion of the substrate 1 which is near the surface thereof. The carriers thus generated are accumulated in the potential wells 6a and 6b. Upon lapse of a prescribed photosensing period, the carriers are read out from the potential wells 6a and 6b and are taken out in the form of output signals of the image sensor. As long as incident light L is applied, the accumulation and reading of carriers are repeated. Photo signals other than the incident light L may generate carriers. The light-shielding film 4 prevents light from entering the substrate at the regions of the sensor other than the photosensing regions and thus prevents unnecessary carries from mixing with the output signals of the image sensor.

An unwanted phenomenon called "light leakage" takes place in the known charge-transfer type image sensor. It will be explained how a light leakage occurs.

One of the important features of the above-described image sensor is "dark signal output". The dark signal output is an output signal converted from carriers which have been generated in a depletion layer region forming the potential wells 6a and 6b when the incident light L is completely shut off. The dark signal output is a noise component which should not be contained in a output signal. It is therefore desired that the dark signal output be as small as possible. Efforts have long been made to reduce the dark signal output of the charge-transfer type image sensors. For example, image sensors are manufactured in such way as to elongate the lifetime of carriers within the substrate and to lessen the crystal defects in the substrate 1 so that fewer carriers are generated in the depletion layer region when the incident light is completely shut off. In order to increase the lifetime of carriers generated in the substrate 1, a heavy metal may be gettered by diffusing phosphorus from the lower surface of the substrate 1. In order to lessen the crystal defect in the substrate 1, the substrate 1 may be annealed after impurity atoms have been introduced in the substrate by, for example, ion-inplantation 1.

If the lifetime of carriers generated in the substrate 1 is increased by the above-mentioned method, the noise component of the output signal will be reduced. That is, the image sensor will produce an output signal having a high S/N ratio (signal-to-noise ratio). When light is applied to the image sensor, however, the potential wells 6a and 6b accumulate not only the carriers generated from the incident light applied to the photosensing regions and the carriers generated in the depletion layer region but also undesirable carriers generated from the light applied to those portions of the substrate 1 which are located not under the light-shielding film 4 and surrounds it. The undesirable carriers 7 diffuse such direction as indicated by arrows shown in FIG. 1 until they reach the potential wells 6a and 6b. Since carriers exist for very long time once they have generated in the substrate 1, the amount of the carriers 7 cannot be neglected, however small it is. The undesirable carriers 7 are equivalent to a component of the incident light L which leaks into the substrate 1 through those portions of the insulating film 2 and the layer 5 which are located not under the light-shielding film 4 and surrounds it. The phenomenon that the undesirable carriers 7 appear in the form of noise in the output signal after reaching the potential wells 6a and 6b is called "light leakage".

The light leakage is intense particularly in an image sensor which produces a small dark signal output This phenomenon is a very significant problem because it reduces the uniformity of sensitivity among the elements which constitute the image sensor.

Diffusion of undesirable carriers affects the operation of not only an image sensor but also other semiconductor devices having charge storage function. For example, it reduces the S/N ratio of a charge-coupled memory and that of a dynamic memory and alters the contents of these memories. It will now be described how diffusion of undesirable carriers affects another semiconductor device having charge storage function, e.g. an MOS dynamic RAM (ransom access memory).

FIG. 2 shows a known MOS dynamic RAM. On a silicon substrate 11 of P conductivity type an insulating film 12 is formed. On the insulating film 12 electron storage electrodes 13 (hereinafter called "storage electrodes") are formed. Formed also on the film 12 are control gate electrodes 14 which are arranged along the storage electrodes 13. Further, impurity regions 15 (or bit lines) of $N^+$ conductivity type are formed in the substrate 11 and located near the control gate electrodes 14. Each storage electrode 13, each control gate electrode 14 and each impurity region 15 constitute a memory cell portion 16. In the portion of the substrate 11 which surrounds the memory cell portions 16 there is formed a periphery circuit, for example a precharging load MOS transistor 20 which comprises an $N^+$ type source 17, an $N^+$ type drain 18 and a gate electrode 19.

The dynamic RAM of FIG. 2 operates in the following way.

When a positive voltage is applied to the storage electrodes 13, potential wells 21 are formed in those portions of the substrate 11 which are located below the storage electrodes 13. The charge is therefore accumulated in the potential wells thus formed. Then a positive voltage pulse is supplied to the control gate electrodes 14, whereby the signal charge is transferred from the potential wells 21 to the impurity regions 15. Thereafter the signal charge is read out from the impurity regions 15. During the reading of the signal charge the precharging load MOS transistor 20 is operated to generate an intense electric field in the vicinity of the drain 18. As a result, impact ionization takes place as the drain voltage ($V_{DD}$) rises. Some of the electrons produced by the impact ionization diffuse in the direction of arrows shown in FIG. 2 and enter the potential wells 21 of the memory cell portions 16. As the undesirable minority carriers flow into the potential wells 21, the contents of the memory cell portions 16 are inverted. This means an erroneous operation of the dynamic RAM.

The above-mentioned impact ionization occurs more often if the gate length of the load MOS transistor 20 is shorter. The impact ionization becomes a serious problem when the dynamic RAM has a high IC packing density.

An object of this invention is to provide a charge storage type semiconductor device wherein undesirable minority carriers are prevented from flowing into charge storage regions formed in a semiconductor substrate and located near the surface of the substrate and to provide a method for producing the charge storage type semiconductor device.

According to this invention a charge storage type semiconductor device is provided, which comprises a semiconductor substrate having a defect region of a high defect density and at least one defect free region, said defect free region having no crystal defects or a low defect density and being formed in the vicinity of at least the major surfaces of the substrate, and means for accumulating charge in those portions of the substrate which are located in the vicinity of one of the major surfaces of the substrate.

This invention can be more fully understood from the following detailed description when taken in conjunction with the accompanying drawings, in which.

Charge storage type semiconductor devices according to this invention each have a semiconductor substrate having a number of crystal defects. But no crystal defect or a few crystal defects, if any, are formed in those portions of the substrate which are very near the surfaces. In the portion of the substrate where a number of crystal defects are found, carriers cease to exist because diffusion distance is short and they do not reach potential wells which are formed in the substrate and which are located near one surface of the substrate. Thus, light leakage, i.e. an unwanted phenomenon inherent to the known charge storage type semiconductor devices, does not take place at all.

Now a charge-transfer type image sensor embodying the present invention will be described with reference to FIG. 3.

Figure 3:
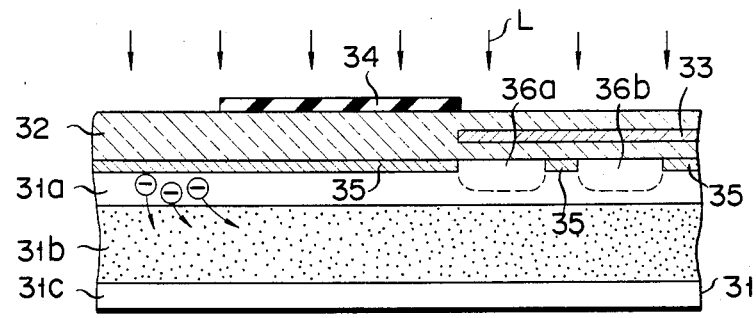
FIG. 3 is a sectional view of a charge-transfer type image sensor according to this invention.

The image sensor shown in FIG. 3 comprises a semiconductor substrate 31, an insulating film 32 formed on the substrate 31, a photo electrode 33 made of a transparent conductive material and embedded in the insulating film 32, a light-shielding film 34 made of an opaque material and so laid on the insulating film 32 that light L reaches only light-receiving regions of the sensor, and a layer 35 formed on the substrate 31 for preventing channel regions from being formed. The layer 35 has the same conductivity type as the semiconductor substrate 31 and a high impurity concentration. It separates potential wells 36a and 36b which are formed beneath the photo electrode 33 and which function as picture elements. That is, the layer 35 acts as a potential barrier. The image sensor further comprises means (not shown) for reading signals from the potential wells 36a and 36b, one after another.

The image sensor of FIG. 3 is characterized by the specific structure of the semiconductor substrate 31. The substrate 31 comprises two defect free regions 31a and 31c and one defect region 31b sandwiched between the regions 31a and 31c. The defect region 31b has a number of crystal defects; its defect density is $10^4/cm^2$ or more, preferably $10^5/cm^2$ to $10^7/cm^2$. The non-defect regions 31a and 31c have no crystal defect or a few crystal defects, if any; their defect density is less than $10^4/cm^2$.

Figure 1:
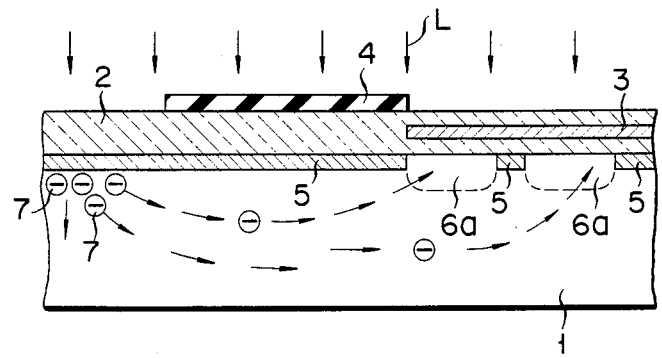
FIG. 1 is a sectional view of a known charge-transfer type image sensor.

It will now be described how to manufacture the image sensor of FIG. 3. The defect region 31b and non-defect regions 31a and 31c of the substrate 31 are formed by special processes. All the other elements of the image sensor of FIG. 3 are formed in the same processes as are carried out to produce the known image sensor shown in FIG. 1. Here it is described how to form the defect region 31b and non-defect regions 31a and 31c only, in case the semiconductor substrate 31 is made of silicon. However, the substrate 1 is not limited to a silicon substrate.

First, a silicon substrate having an oxygen concentration of $1 \times 10^{17}/cm^3$ or more is heated at 600° to 900° C. in a non-oxidizing atmosphere for at least one hour. If the temperature is 800° C., the substrate is heated for about four hours. If the temperature is 650° C., the substrate is heated for about 18 hours. The silicon substrate is heated for the second time at 900° to 1300° C. in an oxidizing atmosphere or a non-oxidizing atmosphere. If the temperature is 1050° C., for example, the substrate is heated for about 24 hours. Heated twice in this manner, the silicon substrate has a defect region 31b and non-defect regions 31a and 31c sandwiching the defect region 31b. The mechanism of forming the defect region 31b and the non-defect regions 31a and 31c may be as will be described in the following paragraph.

Usually a silicon substrate is supersaturated with oxygen atoms. These oxygen atoms were introduced when silicon single crystal was manufactured. They are uniformly distributed in the silicon substrate. During the first heat treatment supersaturation results in forming defect nuclei which will develop crystal defects. The defect nuclei are distributed uniformly within the silicon substrate. During the second heat treatment the defect nuclei develop crystal defects. Also during the second heat treatment the oxygen atoms are diffused out from both major surfaces of the silicon substrate. Therefore, more defect nuclei cease to exist in those portions of the substrate which are located near the major surfaces than in the portion between these portions. This is why the defect free regions 31a and 31c having no crystal defect or a few crystal defects are formed in the vicinity of the major surfaces of the substrate 31 and a defect region 31b having a number of crystal defects is formed between the defect free regions 31a and 31c. The thicknesses of the defect free regions 31a and 31c can be controlled by changing the conditions of the second heat treatment, such as temperature and time.

As mentioned above, the defect density of the defect region 31b is $10^4/cm^2$ or more, preferably $10^5/cm^2$ to $10^7/cm^2$, and the defect density of the defect free regions 31a and 31c is less than $10^4/cm^2$. The defect density of each region was detected in the following method. First, the semiconductor substrate now provided with the defect free regions 31a and 31c and the defect region 31b was heated at 1050° C. for 18 hours. Then the crystal defect located in the substrate are developed by the conventional etching technique. The crystal defects then grew to such size detectable by an optical micro-scope of 100 magnifications. Through the microscope of 100 magnifications the crystal defects per unit area were counted.

The defect region 31b and the defect free regions 31a and 31c may be formed in a method other than the above-described two-step heat treatment. For instance, after the above-mentioned first heat treatment a thermal diffusion of impurity, instead of the second heat treatment, may be conducted on the silicon substrate 31 exactly in the same way as is carried out in manufacturing the known image sensor of FIG. 1.

The charge-transfer type image sensor shown in FIG. 3 is advantageous in the following respects.

First, the diffusion length of carriers in the defect region 31b is shorter than that of carriers existing in the difect free regions 31a and 31c. For example, the diffusion length of carriers in a region having a defect density of $10^5/cm^2$ or more is half to fourth of that in a region having no crystal defect. Diffusion length of short carrier diffusion length is less than 40 microns. Most of a carrier generated by light incident to those surfaces of the substrate 31 which are not covered with the light-shielding film 34 and surrounds it recombines in the defect region 31b and does not reach the potential wells 36a and 36b formed under the photo electrode 33. Obviously, a light leakage is avoided, which is an unwanted phenomenon occuring inevitably in the known charge-transfer type image sensor.

Secondly, in the defect free region 31a, which has no crystal defect or a few crystal defects, there is generated no dark current spike which would otherwise be generated. With no dark current spike contained in it, the output signal of the image sensor serves to reproduce an image of a high quality.

Thirdly, the output signal of the image sensor is free of noise which is generated from undesirable carriers electrically injected into the silicon substrate 31. A clock pulse is applied to a transfer electrode of a charge-transfer device thereby to transfer charge. The lead-out portion of the transfer electrode is usually provided with a protective diode with a p-n junction in order to enhance the withstand voltage of the image sensor. When a clock pulse is under-shot, the p-n junction of the protective diode is biased in forward direction. As a result, undesirable carriers are injected into the silicon substrate and reach the potential wells formed in the substrate. A noise is therefore contained in an output signal. To avoid undesirable carriers the clock signal of a desired waveform must be applied to the transfer electrode. To provide a clock pulse having a desired waveform the peripheral circuits should be specially designed. By contrast, in the image sensor of FIG. 3 a noise resulting from unnecessary carriers injected into the substrate 31 can be much reduced in the same way as the light leakage is reduced, because most of the unnecessary carriers do not reach the potential wells 36a and 36b.

Figure 4A:
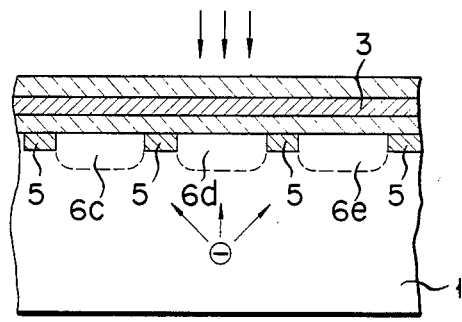
FIGS. 4A and 4B are respectively a sectional view of the image sensor of FIG. 1 and a sectional view of the image sensor of FIG. 3, illustrating the difference between these image sensors with respect to image pickup characteristic.
Figure 4B:
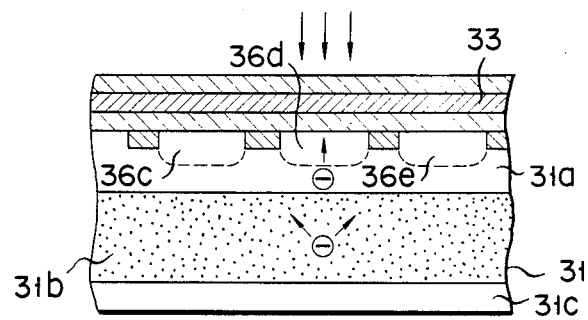

Fourthly, the image sensor has an improved image resolution. Referring to FIGS. 4A and 4B, it will be explained why. Carriers are generated by the long wavelength component of incident light, usually at some depth in the interior portion of a silicon substrate. In such known image sensor as shown in FIG. 4A, when if light illuminates to only one of the picture elements of the image sensor, carriers generated within a silicon substrate 1 at some depth are accumulated not only in a potential well 6d formed right below the picture element but also in potential wells 6c and 6e formed below the other adjacent picture elements. As a result, the other adjacent picture elements produce outputs of an abnormally high level though they are put in dark condition. This inevitably degrades the resolution characteristic of the image sensor. By contrast, in the image sensor of this invention shown in FIG. 4B carriers generated within the silicon substrate 31 cease to exist while diffusing in the defect region 31b. The amount of carriers accumulated in the potential wells 36c and 36e is much smaller than that of carriers accumulated in the potential wells 6c and 6e of the known image sensor shown in FIG. 4A. The resolution characteristic of the image sensor shown in FIG. 4B is not noticeably degraded.

Figure 5:
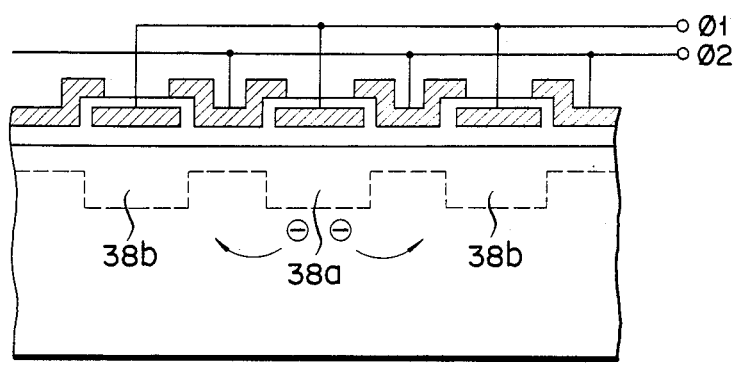
FIG. 5 is a sectional view of another image sensor according to this invention, which has an improved blooming property.

Fifthly, a so-called "blooming of carriers" which is caused by application of intense light is lessened in the image sensor according to this invention. Referring to FIG. 5, it will be described why. FIG. 5 shows an image sensor provided with a light-sensing section which comprises electrodes $\phi_1$ and electrodes $\phi_2$ for separating elements of the image sensor. Depletion layers are formed in a silicon substrate at positions right below the electrodes $\phi_1$. Carriers are accumulated in those portions of the substrate which are located beneath the electrodes $\phi_2$. Potential wells are formed in the substrate; they are located respectively below the electrodes $\phi_1$. One of the potential wells is designated by "38a" and the others are by "38b". Suppose an intense incident light is applied to the image sensor and that only the potential well 38a is filled with carriers. Then, excessive carriers will be injected into the silicon substrate because those portions of the substrate which lie among the potential well 38a and the adjacent potential wells 38b are already full of carriers. The excessive carriers diffuse through the silicon substrate and are accumulated in the potential wells 38b which are located below the respective picture elements of the image sensor. This phenomenon is called "blooming". "Blooming" is suppressed in the image sensor of this invention since carriers injected into the silicon substrate disappear in the defect region 31b.

As mentioned above, according to this invention the troubles arising from carrier diffusion in a semicondcutor substrate are eliminated. This makes it possible to provide a charge-transfer image sensor which has a good resolution characteristic, which suppress the blooming effect and which shows a good uniformity of sensitivity among the elements.

Thus far described is a charge-transfer image sensor according to this invention. The invention is not of course limited to an image sensor of this type. It may be applied to other charge storage type semiconductor devices. Now an MOS dynamic RAM embodying the invention will be described.

Figure 6:
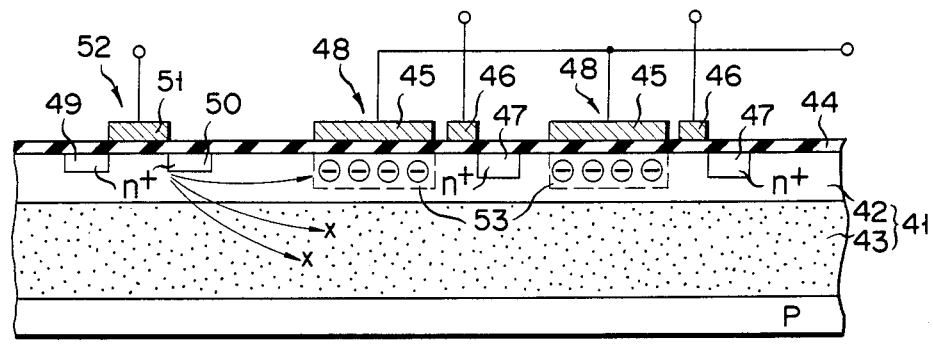
FIG. 6 is a sectional view of a dynamic RAM, another embodiment of this invention.

As shown in FIG. 6, a dynamic RAM according to this invention comprises a P-type silicon substrate 41, a insulating film 44 formed on the substrate 41, storage electrodes 45 formed on the insulating film 44 and control gate electrodes 46 formed on the film 44 and near the respective storage electrodes 45. Like the substrate 31 of the image sensor shown in FIG. 3, the silicon substrate 41 consists of two non-defect regions 42 which are located near the upper and lower surfaces, respectively and one defect region 43 which are sandwitched between the non-defect regions 42. Further, impurity regions 47 (or bit lines) are formed in those portions of the silicon substrate 41 which lie near the control gate electrodes 46 but not below the electrodes 46. The impurity regions 47 are of N+ type, i.e. the conductivity type opposite to that of the substrate 41. Each storage electrode 45, each control gate electrode 46 and each impurity region 47 constitute a memory cell portion 48. In the portion of the substrate 41 which surrounds the memory cell portions 48 there is formed a periphery circuit, for example a precharging load MOS transistor 52 which comprises an N+ type source 49, an N+ type drain 50 and a gate electrode 51. The dynamic RAM of FIG. 6 operates in the following way.

When the precharging load MOS transistor 52 is operated in order to read data from the dynamic RAM, an intense electric field is generated in the vicinity of the drain 50. As a result, the drain voltage ($V_{DD}$) of the transistor 52 rises, and impact ionization occurs. Some of the electrons generated by the impact ionization (i.e. minority carriers) diffuse in the silicon substrate 41 in the direction of arrows shown in FIG. 6. But they recombine in the defect region 43 because the defect region 43 has but an extremely short diffusion length. Undesirable minority carriers are therefore prevented from flowing into potential wells 53 which are formed respectively beneath the storage electrodes 45 of the memory cell portions 48. Thus, the dynamic RAM is free of an error due to accumulation of undesirable carriers in the potential wells 53.

Figure 2:
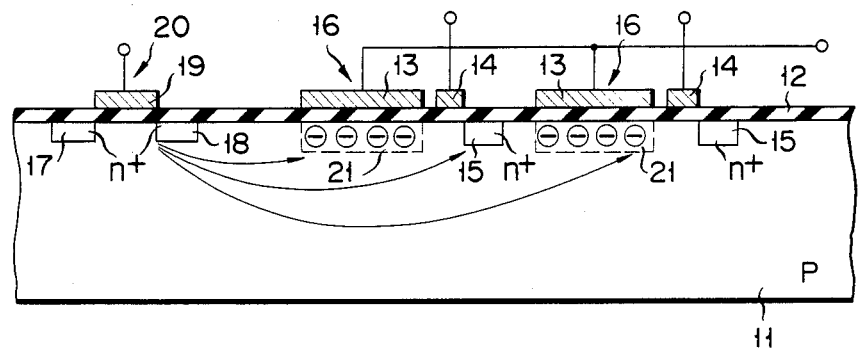
FIG. 2 is a sectional view of a known dynamic RAM.

Since the defect region 43 has a very short diffusion distance, it is possible to reduce the distance between the memory cell portions 48 and the periphery circuit, i.e. the precharging load MOS transistor 52. This helps enhance the IC packing density of the dynamic RAM. Moreover, since the amount of minority carriers flowing into the potential wells 53 is reduced very much, the periphery circuit may be designed more freely so as to improve the element characteristic of the dynamic RAM. For instance, even if the gate length of the load MOS transistor 52 is shortened, the drain voltage ($V_{DD}$) can be higher than in the known dynamic RAM of such a structure as illustrated in FIG. 2. A higher drain voltage ($V_{DD}$) of the load MOS transistor 52 means a higher speed of the dynamic RAM.

Figure 7:
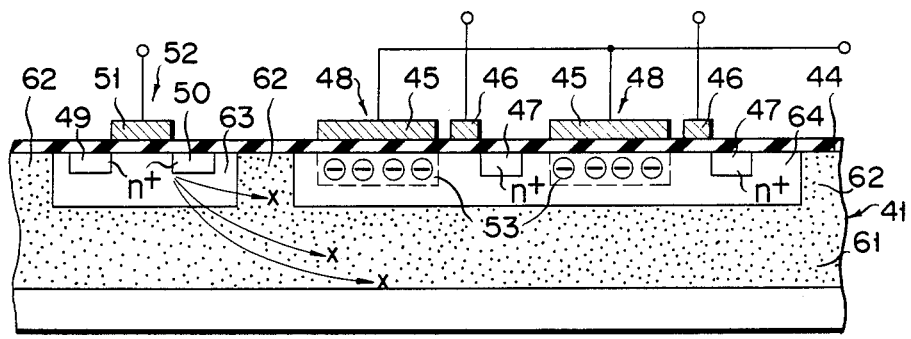
FIG. 7 is a sectional view of a dynamic RAM, still another embodiment of this invention.

In both the image sensor of FIG. 3 and the dynamic RAM of FIG. 6, some of the carriers injected into the semiconductor substrate diffuse in the defect free region located near the upper surface of the substrate and inevitably reach the potential wells. The thickness of the defect free region differs according to the oxygen concentration of the substrate and the conditions of heat treatment conducted on the substrate. But the defect free region must be thicker than the depletion layer and must be, for example, 5 to 60 microns thick. If the defect free region is relatively thick, the number of carriers which diffuse in the defect free region and which reach the potential wells is significantly large and causes troubles. FIG. 7 shows a dynamic RAM wherein no carriers diffusing in a defect free region located near the upper surface of a semiconductor substrate reach potential wells.

The dynamic RAM of FIG. 7 is identical with the dynamic RAM of FIG. 6 except that in that portion of a P type silicon substrate 41 which lies near the upper surface of the substrate 41 there are formed a narrow defect region 62 connected to a defect region 61 and island-like defect free regions 63 and 64. In the defect free region 63 a precharging load MOS transistor 52 is formed, and in the defect free region 64 memory cell portions 48 are formed. The narrow defect region 62 surrounds the memory cell portions 48 and separates the memory cell portions 48 from the periphery circuit, i.e. transistor 52. The region 62 therefore prevents unnecessary carriers, which may be generated by impact ionization occurring upon operation of the transistor 52, from flowing into the potential wells 53. Thus, less unnecessary carriers flow into the potential wells 53 than in the dynamic RAM shown in FIG. 6. The dynamic RAM of FIG. 7 is more reliable than the dynamic RAM of FIG. 6. Further, it is advantageous over the RAM of FIG. 6 in that the distance between the transistor 52 and the memory cell portions 48 can be more shortened. The dynamic RAM of FIG. 7 eliminates the drawbacks of the known dynamic RAM shown in FIG. 2.

The narrow defect region 62 may be formed by, for example, applying a laser beam to a selected portion of the defect free region formed by heat treatment, thus converting the selected portion into a defect region.

What we claim is:

1. A charge storage type semiconductor device comprising:
   a semiconductor substrate comprised of a single, crystal, said substrate having an interior short carrier diffusion length region with a crystal defect density of from $10^5/cm^2$ to $10^7/cm^2$, and at least one long carrier diffusion length region, said long carrier diffusion length region being formed in the vicinity of at least one of the major surfaces of the substrate, said long carrier diffusion length region having a thickness of from about 5 to 60 microns; and
   means for accumlating charge in those portions of the substrate which are located in the vicinity of one of the major surfaces of the substrate, said interior region being separated from said charge accumulating means.

2. A charge storage type semiconductor device according to claim 1, wherein the diffusion length of said long carrier diffusion length region is more than twice of that of said short carrier diffusion length region.

3. A charge storage type semiconductor device according to claim 1 or 2, wherein the diffusion length of said short carrier diffusion length is less than 40 microns.

4. A charge storage type semiconductor device comprising:
a substrate of semiconductor material in the form of a singe crystal, said substrate having an interior portion having a crystal-defect density of from $10^5/cm^2$ to $10^7/cm^2$, and at least one relatively defect free region adjacent one surface of said substrate, said region having a relatively low defect density with respect to said interior portion and a thickness of about 5 to 60 microns; and
means for accumulating charge in locations in said defect-free regions adjacent said surface of said substrate, said interior portion being separated from said location in said defect free regions.

5. A charge storage type semiconductor device according to claim 4, wherein said means for accumulating charge comprises means for forming potential wells in said locations adjacent said surface of said semiconductor substrate and means for generating and transferring charge to said potential wells.

6. A charge storage type semiconductor device according to claim 4, wherein a narrow defect containing region is formed in that portion of said semiconductor substrate which is located near one of the major surfaces of said substrate, said narrow defect containing region being connected to said interior portion and surrounding said means for accumulating charge; and said defect free region formed in the vicinity of the major surface of said substrate is divided by said narow defect containing region into island-like regions.

7. A charge storage type semiconducotor device according to claim 4, which is a charge-transfer type image sensor.

8. A charge storage type semiconductor device according to claim 4, which is an MOS dynamic RAM.

9. The device of claim 4 wherein said defects in said interior portion are induced thermally.

* * * * *